US009276040B1

(12) United States Patent
Marshall et al.

(10) Patent No.: US 9,276,040 B1
(45) Date of Patent: Mar. 1, 2016

(54) MAJORITY- AND MINORITY-GATE LOGIC SCHEMES BASED ON MAGNETO-ELECTRIC DEVICES

(71) Applicants: Board of Regents of the University of Nebraska, Lincoln, NE (US); The Board of Regents of The University of Texas System, Austin, TX (US); The Research Foundation for the State University of New York STOR—University at Buffalo, Amherst, NY (US)

(72) Inventors: Andrew Marshall, Richardson, TX (US); Peter A. Dowben, Crete, NE (US); Jonathan P. Bird, Buffalo, NY (US)

(73) Assignees: BOARD OF REGENTS OF THE UNIVERSITY OF NEBRASKA, Lincoln, NE (US); BOARD OF REGENTS, THE UNIVERSITY OF TEXAS SYSTEM, Austin, TX (US); THE RESEARCH FOUNDATION FOR THE STATE UNIVERSITY OF NEW YORK, Amherst, NY (US)

( * ) Notice: Subject to any disclaimer, the term of this patent is extended or adjusted under 35 U.S.C. 154(b) by 0 days.

(21) Appl. No.: 14/598,867

(22) Filed: Jan. 16, 2015

Related U.S. Application Data

(60) Provisional application No. 62/069,138, filed on Oct. 27, 2014.

(51) Int. Cl.
*H03K 19/173* (2006.01)
*H01L 29/82* (2006.01)
(Continued)

(52) U.S. Cl.
CPC .............. *H01L 27/228* (2013.01); *H01L 43/02* (2013.01); *H01L 43/08* (2013.01); *H03K 19/16* (2013.01)

(58) Field of Classification Search
CPC ....... H03K 19/173; H01L 29/82; G11C 11/00
USPC ............................................. 326/37; 257/295
See application file for complete search history.

(56) References Cited

U.S. PATENT DOCUMENTS

| 5,640,343 A | 6/1997 | Gallagher et al. |
| 5,841,692 A | 11/1998 | Gallagher et al. |

(Continued)

FOREIGN PATENT DOCUMENTS

WO    2009011956 A2    1/2009

OTHER PUBLICATIONS

Orlov, A., et al.; "Magnetic Quantum-Dot Cellular Automata: Recent Developments and Prospects"; Journal of Nanoelectronics and Optoelectronics, vol. 3, No. 1; (2008); 14 pages.

(Continued)

*Primary Examiner* — Daniel D Chang
(74) *Attorney, Agent, or Firm* — Talem IP Law, LLP

(57) ABSTRACT

Majority and minority logic can be implemented by voltage controlled switching of magneto-electric layers of magneto electric magnetic tunnel junction (ME-MTJ) devices. A ME-MTJ device includes an exchange bias-controlled switching element and a pinned ferromagnetic layer on an antiferromagnetic layer. In one case, the switching element includes a magneto electric (ME) layer on a free ferromagnetic (FM) layer, and is separated from the pinned FM layer by an insulator. To implement a majority or minority logic gate a single ME-MTJ device may be used where the device is provided with three electrodes contacting the ME layer in an overlaying relationship with the ME layer. The orientation of the pinned FM layer indicates whether the gate is a majority or a minority logic gate.

19 Claims, 5 Drawing Sheets

(51) Int. Cl.
 *H01L 27/22* (2006.01)
 *H01L 43/02* (2006.01)
 *H01L 43/08* (2006.01)
 *H03K 19/16* (2006.01)

(56) References Cited

U.S. PATENT DOCUMENTS

| | | | |
|---|---|---|---|
| 8,748,957 B2 | 6/2014 | Kelber et al. | |
| 9,006,704 B2 * | 4/2015 | Jan | H01L 29/66984 257/1 |
| 2009/0279353 A1 * | 11/2009 | Worledge | H01L 29/82 365/171 |

OTHER PUBLICATIONS

Li, Wei, et al.; "Three-input Majority Logic Gate and Multiple Input Logic Circuit Based on DNA Strand Displacement"; Nano Letters, vol. 13, No. 6; (2013); 9 pages.

Ortega, N., et al.; "Multifunctional Magneoelectric Materials for Device Applications"; (2014); 31 pages. Available at: http://arxiv.org/abs/1403.1838.

Nikonov, Dmitri E., et al.; "Overview of Beyond-CMOS Devices and a Uniform Methodology for Their Benchmarking"; Proceedings of the IEEE, vol. 101, Issue 12; (Dec. 2013); 36 pages.

* cited by examiner

MAJORITY- AND MINORITY-GATE LOGIC SCHEMES BASED ON MAGNETO-ELECTRIC DEVICES

CROSS REFERENCE TO RELATED APPLICATION

This application claims the benefit of U.S. Provisional Application Ser. No. 62/069,138, filed Oct. 27, 2014, which is hereby incorporated by reference in its entirety, including all figures, tables and drawings.

This invention was made with government support under Cooperative Agreement No. 70NANB12H107 awarded by NIST. The government has certain rights in the invention.

BACKGROUND

Significant research effort has been devoted to find alternative devices that can perform the Boolean logic operations commonly implemented through the use of Complementary Metal-Oxide-Semiconductor (CMOS) transistors. One such Boolean logic operation is the majority function, where a true value (logical one value) is returned if and only if more than 50% of its inputs are true. In CMOS, the majority function logical gate is formed from complex circuitry. However, the majority function, as well as the minority function, have numerous applications. For example, a full adder can be implemented using a majority function to determine a carry output. In addition, the majority function can be part of a threshold determination or a median calculation.

BRIEF SUMMARY

Magneto-electric (ME) magnetic tunnel junction (MTJ)-based Boolean devices are described. In one described embodiment, a single ME-MTJ device can implement a majority logic gate. In another described embodiment, a single ME-MTJ device can implement a minority logic gate. In yet another described embodiment, three ME-MTJ devices implement a majority logic gate.

A ME-MTJ majority or minority logic gate can include at least three input gates on a magneto electric material layer of a ME-MTJ device. The combined effect of the electric fields of the at least three input gates when an appropriate voltage is applied induce switching of the magneto electric material layer, which is on a free ferromagnetic layer that is connected to ground. An insulating layer separates the free ferromagnetic layer from a pinned ferromagnetic material layer that is pinned in a particular direction (polarization) by an antiferromagnetic material layer. The output voltage can be read from the pinned ferromagnetic material layer, which swings between ground and a VDD voltage.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

DETAILED DESCRIPTION

Voltage controlled switching of magneto-electric layers of magneto electric magnetic tunnel junction (ME-MTJ) devices is used to implement majority (and minority) logic. Advantageously, since no current flows in the switching process of the ME-MTJ device, switching can be achieved with low power consumption (e.g., less than or equivalent to CMOS devices), and not requiring the much larger current densities needed for spin transfer torque magnetic tunnel junctions. Integrated schemes for majority (and minority) logic are presented in which just a single device can be used to implement majority or minority logic through the application of multiple voltages to an active magneto-electric layer of the ME-MTJ device.

The described majority/minority gates can be used to create effectively any logic requirement, from simple gates to microprocessors. The ME-MTJ structure has inherent memory, enabling the devices to be used as memory units. The described devices have numerous applications including the averaging function (median calculation). Various implementations may be interfaced with (at input, output, or both) technologies such as complementary metal oxide semiconductor (CMOS) and tunneling field effect transistors (TFETs)

In one described embodiment, the single ME-MTJ device can implement a majority logic gate. In another described embodiment, the single ME-MTJ device can implement a minority logic gate. In yet another described embodiment, three (or more) discrete ME-MTJ devices implement a majority or minority logic gate.

Figure 1:
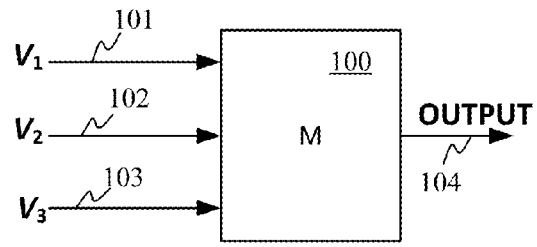
FIG. 1 illustrates a three-input majority or minority logic gate block.

FIG. 1 illustrates a three-input majority or minority logic gate block. It should be understood, of course, that more than three inputs may be applied to ME-MJT majority or minority logic gates and the three input gate electrodes illustrated in the figures and referred to repeatedly herein are simply one example implementation shown for illustrative purposes. That is, any odd number of inputs may be provided so long as the magnetoelectric material of the ME-MJT is sensitive enough to switch when the majority state is reached. The resolution (number of possible inputs) may be defined by the thermal limit of the materials of the device.

As shown in FIG. 1, a block representation of a three-input majority or minority logic gate block 100 includes three inputs through which a voltage can be applied, for example a first input 101 for applying $V_1$, a second input 102 for applying $V_2$, and a third input 103 for applying $V_3$. The output 104 of the logic gate block 100 represents the majority (or minority) value. That is, when logic gate block 100 is a majority logic gate, the output 104 is high (logic 1) when at least two of the three inputs 101, 102, and 103 is high (logic 1); and when logic gate block 100 is a minority logic gate, the output 104 is high (logic 1) when at least two of the three inputs 101, 102, and 103 is low (logic 0). A single device ME-MJT implementation for a majority logic gate version and a minority logic gate version of the logic gate block 100 are respectively shown in FIGS. 2A and 2B. In particular, FIG. 2A is a diagram of a ME-MJT majority logic gate and associated logic table for the logic gate block of FIG. 1; and FIG. 2B is a diagram of a ME-MJT minority logic gate and associated logic table for the logic gate block of FIG. 1.

Figure 2A:
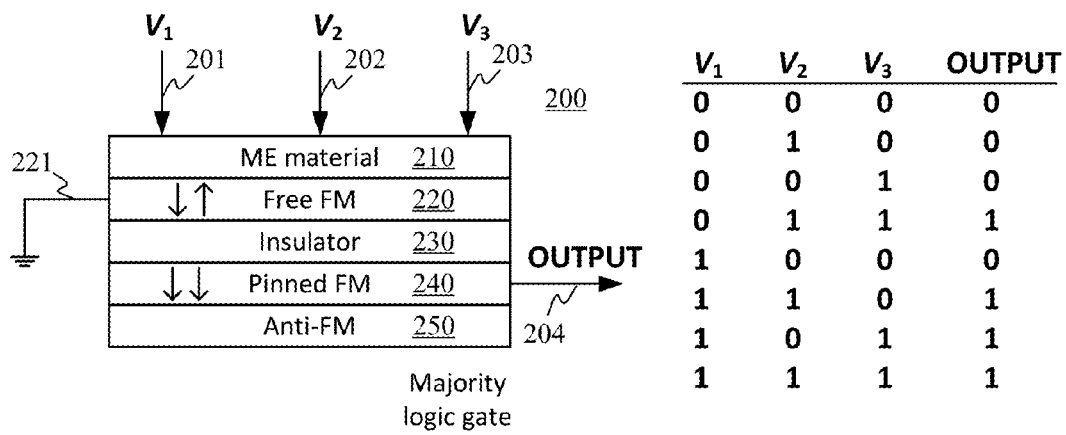
FIG. 2A is a diagram of a ME-MJT majority logic gate and associated logic table for the logic gate block of FIG. 1.
Figure 2B:
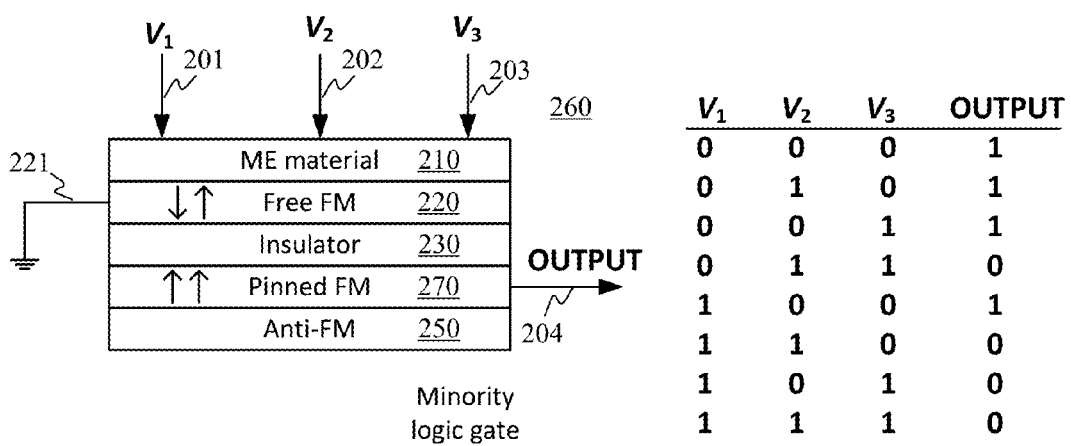
FIG. 2B is a diagram of a ME-MJT minority logic gate and associated logic table for the logic gate block of FIG. 1.

Referring to FIG. 2A, a majority logic gate 200 having three inputs 201, 202, 203 and an output 204 can be implemented using a single ME-MJT device. The inputs 201, 202, 203 can be disposed on a magneto-electric (ME) material 210 of the ME-MJT device to apply voltage and perform voltage controlled switching. In the example illustration shown in FIG. 2A, the ME-MJT device includes a stack, from top to bottom, of the ME material 210, a free FM layer 220 connected to ground 221, an insulator 230, a pinned FM 230 from which the output 204 is read, and an anti-FM layer 250. The pinned FM 240 is pinned in a particular direction by the Anti-FM layer 250.

The ME material 210 is gated using the combined effect of three electrodes for the three inputs 201, 202, and 203. The fringing electric field generated by the voltages $V_1$, $V_2$, and $V_3$ applied to the gates induce switching of the ME material 210. When the voltage applied by the combination of the gates at the ME material 210 achieves a prescribed value, the device stores a voltage value indicative of a logic 1. The voltages may be relatively low (e.g., of the order of 0.1 to 0.2 V as compared to 0.7 to 1 V for current CMOS designs) so that the combined voltage may be possibly less than 6 kV/cm or 100 mV per gate. Depending on the voltage, which represents a logic 0 or logic 1, the output at the pinned FM 230 indicates the single domain state of the magneto-electric layer, and hence the state of the device. In some cases, since a non-volatile state is achieved, once switched, the logic can be polled periodically to determine the state. The device implements a majority gate logic through selection of ME material that switches upon application of a range of suitable voltages for the combination of two or three of the three gates. Additional inputs are possible depending on the supply voltage and materials selected.

As illustrated by the logic table for the three-input majority logic gate 200, when two or all three of the three inputs are "0", the output is "0". In addition, when two or all three of the inputs are "1", the output is "1". Interestingly, by forcing $V_1$ to logic level 0, the three-input majority logic gate 200 can function as an AND gate, and by forcing $V_1$ to logic level 1, the three-input majority logic gate 200 can function as an OR gate. This provides a programmable, optional logic gate function using a single ME-MJT device.

Referring to FIG. 2B, a minority logic gate 260 having three inputs 201, 202, 203 and an output 204 can also be implemented using a single ME-MJT device. The majority logic gate 200 and the minority logic gate 260 can have nearly a same structure. The difference between the two structures can be simply the direction to which the ferromagnetic material on the anti-FM layer 250 is pinned. In particular, the pinned FM 240 for the majority logic gate 200 is pinned in one direction while the pinned FM 270 for the minority logic gate 260 is pinned in the opposite direction. The result of this inverse pinning is an inverse value at the output. As can be seen in the logic table for the minority logic gate 260, the output is high (logic 1) when one or none of the applied voltages are high (e.g., a majority of the applied voltages are low-logic 0).

Figure 3A:
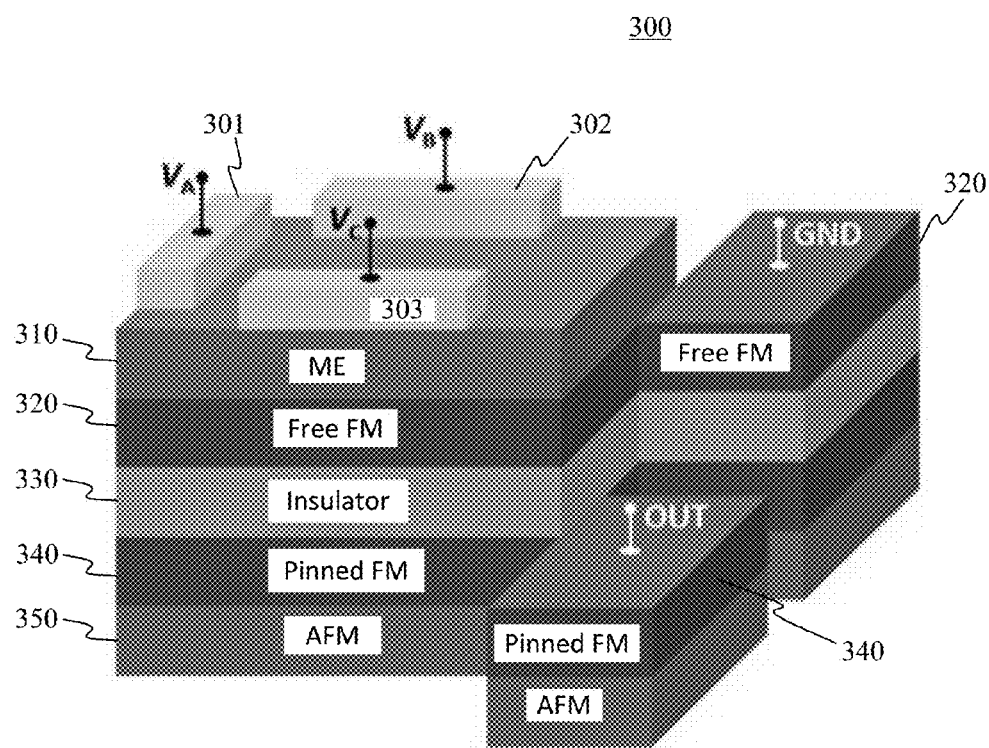
FIGS. 3A and 3B illustrate an example perspective schematic representation and a layout view, respectively, of a ME-MJT majority or minority logic gate block according to one configuration.
Figure 3B:
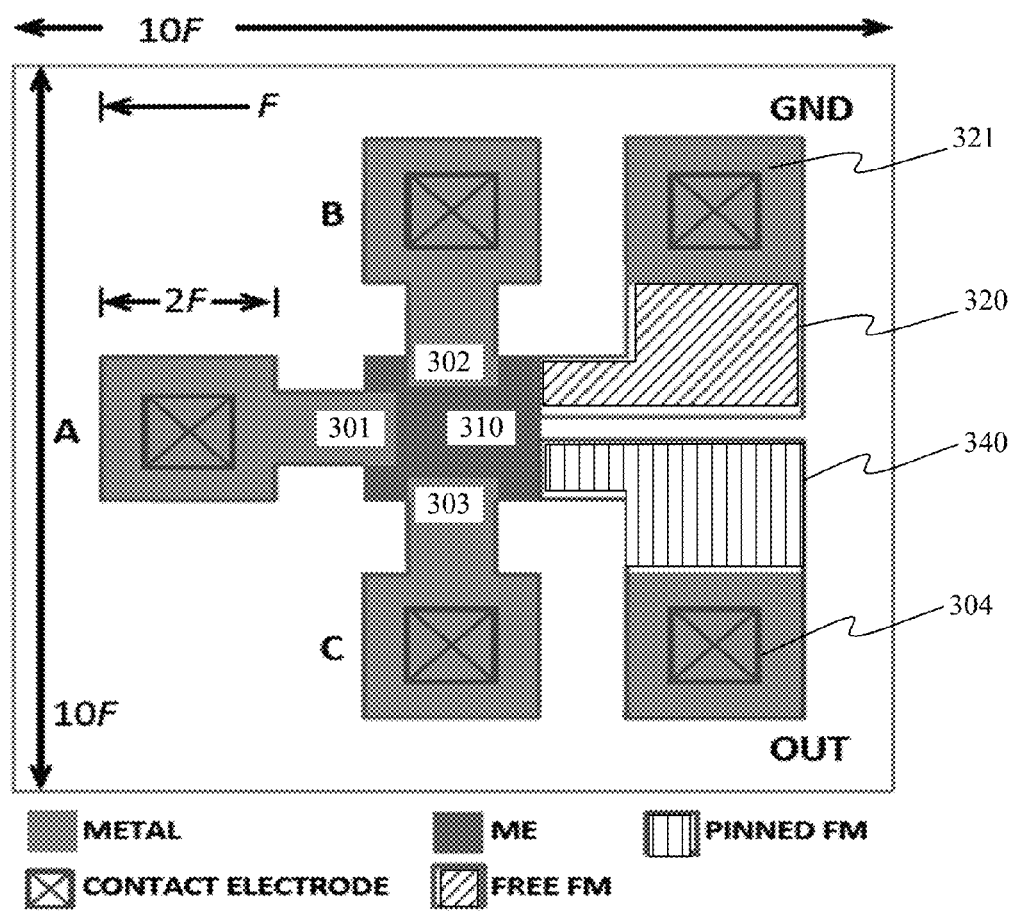

FIG. 3A illustrates an example perspective schematic representation of a ME-MJT majority or minority logic gate block according to one configuration; and FIG. 3B illustrates an example layout view for the ME-MJT logic gate of FIG. 3A.

As described with respect to FIGS. 2A and 2B, a three input ME-MJT majority or minority logic gate 300 can include three input electrodes 301, 302, 303 and an output electrode 304. The input electrodes 301, 302, 303 can be disposed on a magneto-electric (ME) material 310 as gates to apply voltage and perform voltage controlled switching of a ferromagnetic material (free FM layer 320) that is connected to ground 321. In particular, the combination of the three or more gates of the device is used to achieve a strongly enhanced switching field at lower voltages by exploiting the collective fringing electric fields that emanate from the ends of the gates.

The arrangement of the three input electrodes 301, 302, and 303 are shown overlying three of the four sides of the quadrilateral shape of the top surface of the ME material 310. In some cases, more than one input electrode may be overlying a particular side. In other cases, the input electrodes may be arranged in parallel rows on the ME material 310. For example, The ME material 310 interacts with the FM layer 320 at their interface as a result of the exchange bias effect from the applied voltages. Here, the exchange bias is an interaction of spins at the interface of the ME material 310 and the FM layer 320. The spins at the contacting surface of the ME material 310 have a net polarization that bias the hysteresis loop of the FM layer 320 similar to an effective magneto-electric field. The ME material 310 can be an antiferromagnetic material such as chromia ($Cr_2O_3$), boron doped chromia, or rare earth ferrite ($ReFeO_3$; Re=Gd, Tb, Yb, Lu, etc.) or indeed other multiferroic magneto-electric materials such as $SrCo_2Ti_2Fe_8O_{19}$ or $Ni_{0.5}Zn_{0.5}Fe_2O_4$ where there is a high boundary polarization and/or other significant nonlinear magneto-electric effect. In some cases, switching can be accomplished using a multiferroic material such as BFO ($BiFeO_3$).

An insulator 330 separates the free FM material 320 from a pinned FM material 340 formed on an antiferromagnetic (AFM) layer 350. The material for the insulator 330 can be any suitable dielectric that can be grown pinhole free and thin, for example MgO or h-Bn; however, BaTiO3 or SrTiO3 may be preferred for the case when the free FM material 320 is $La_{0.65}Sr_{0.35}MnO_3$. In any case, the material for the insulator is selected based on the material of the ferromagnet so as to optimize tunnel magneto-resistance ratio. In addition, the insulator 330 is sufficiently thin that quantum-mechanical tunneling of the charge carriers occurs between the two ferromagnetic layers 320 and 340. Accordingly, under the effect of the exchange bias from the ME material 310, the free FM layer 320 can be used to define two distinct states of the output 304, either parallel or antiparallel to the pinned FM material 340, where these states represent a logical "1" or "0" bits.

The free FM material 320 and the pinned FM material 340 can be formed of, for example, cobalt (Co), iron (Fe), iron oxide ($\gamma$-$Fe_2O_3$, FeO, $Fe_3O_4$), manganese bismuth (MnBi), nickel (Ni), and/or chromium oxide ($CrO_2$). In certain implementations, the FM material (for the free FM and/or the pinned FM) is formed of an L10 compound such as FePt, FePd, CoPt, or CoPd, or even FePt, FePd, CoPt, or CoPd multilayers with their moments aligned in the same direction as the magneto-electric interface. In some cases, the FM material may be a perovskite such as $LaSrMnO_3$.

The AFM layer 350 can be a hematite, metal (such as chromium), alloy (such as iron manganese (FeMn)), or oxide (such as nickel oxide (NiO), manganese oxide ($MnO_2$) or $LaMnO_3$) that exhibits a manifestation of ordered magnetism; for example, where the magnetic moments align in a regular pattern with neighboring spins on different sublattices but so that at the interface between the ferromagnet and antiferromagnet, all moments are parallel. The AFM layer 350 material is selected so that its antiferromagnetic interface layer has parallel spins where these spins are aligned along the same axis of the adjacent ferromagnet to "pin" the ferromagnet (providing the pinned FM 340). For example, an antiferromagnet with type A cut along (001), type C aligned along (011) or type E (111) have parallel moments at the interface and may be used.

The pinned FM material 340 can be grown upon the AFM 350 or annealed in an aligning magnetic field, causing the surface atoms of the FM layer 340 to align with the surface atoms of the AFM 350 and, thus, causing the FM layer 340 be "pinned" to a particular orientation by the exchange bias interaction between the interface of the AFM layer 350 and the FM material 340.

Figure 4:
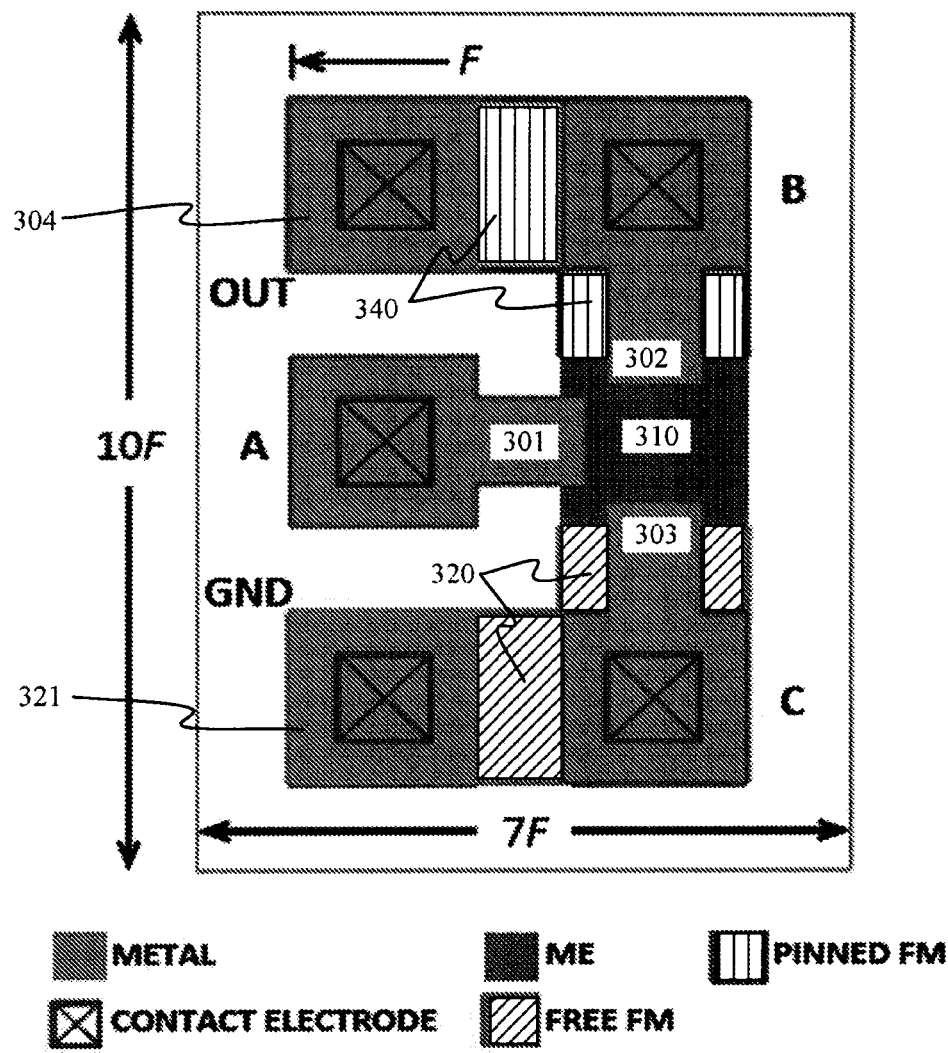
FIG. 4 illustrates an example compressed layout view of a ME-MJT majority or minority logic gate.

FIG. 4 illustrates an example compressed layout view of a ME-MJT majority or minority logic gate. In contrast to the total cell area of 100 $F^2$ (where F refers to the half pitch) for the layout design shown in FIG. 3B, the compressed layout of FIG. 4 has a total cell area of 70 $F^2$. In the design shown in FIG. 4, the three input electrodes 401, 402, 403 are arranged on the ME layer 410 similarly to the three input electrodes 301, 302, 303 of FIG. 3B. However, in the layout design of FIG. 4, the ground 421 contact to the free FM layer 420 and the output 404 contact to the pinned FM 440 are aligned along a same column (but on different layers) as the contact to one input electrode 401. It should be understood that other design layouts may be utilized.

Figure 5:
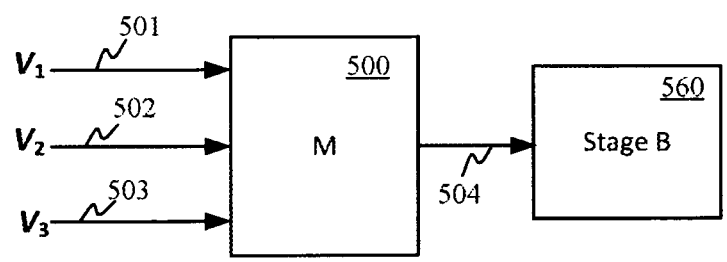
FIG. 5 illustrates a block diagram of a two stage circuit.

The described ME-MJT majority or minority logic gates can be implemented as part of larger, more complex circuits. FIG. 5 illustrates a block diagram of a two stage circuit. Referring to FIG. 5, a majority or minority logic gate 500, for example that receives three inputs 501, 502, and 503, can provide its output 504 to a second stage 560. The second stage 560 may be another ME-MJT-based logic block or a CMOS or TFET or other electronic circuitry block.

Figure 6:
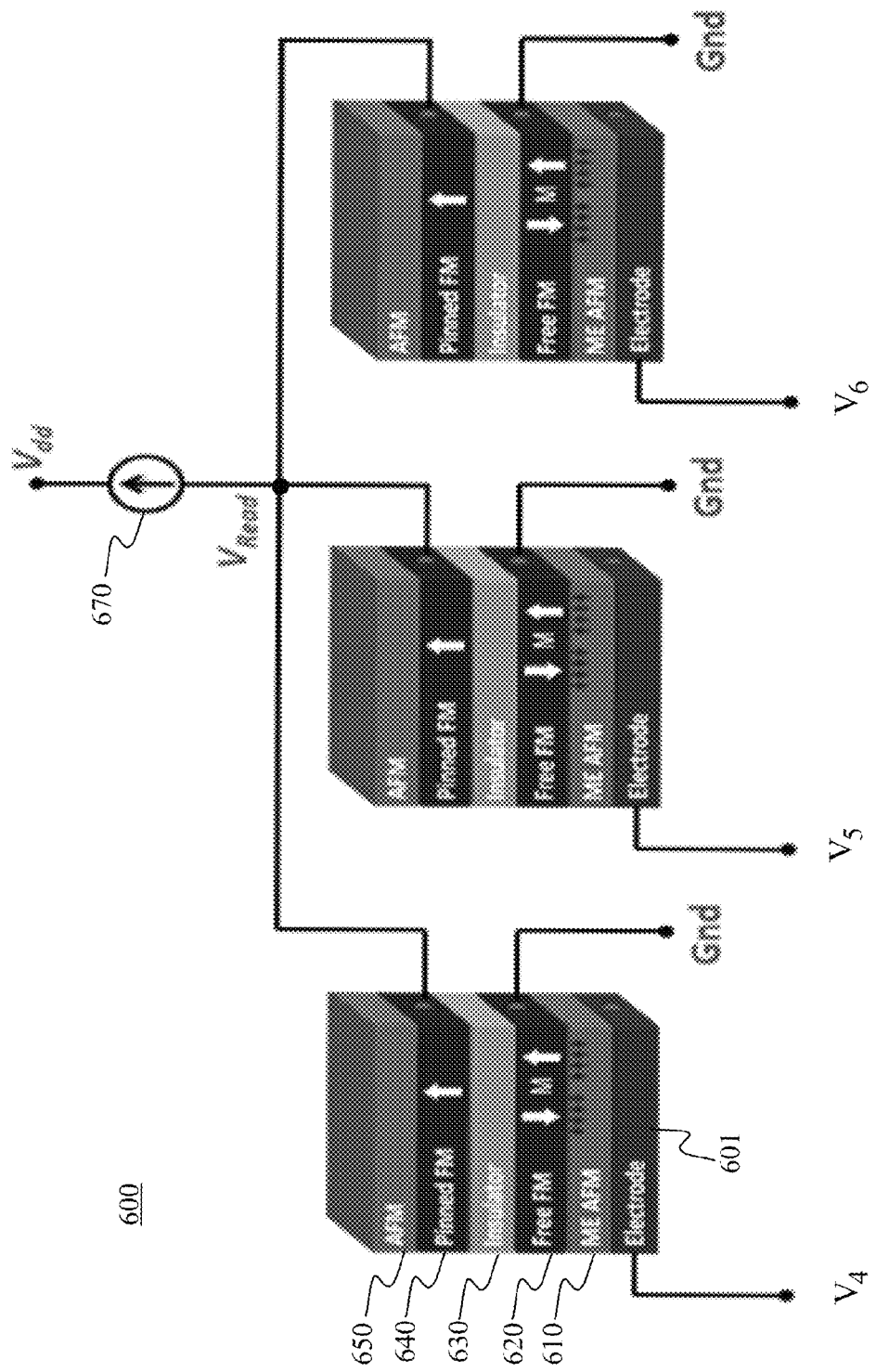
FIG. 6 illustrates a logic gate implemented with discrete ME-MJT devices.

FIG. 6 illustrates a logic gate implemented with discrete ME-MJT devices. In the implementation illustrated in FIG. 6, a three-input ME-MTJ majority or minority logic gate 600 is formed of discrete ME-MJT device stacks of electrode 601, ME material 610, free FM 620, insulator 630, pinned FM 640, and AFM 650 that are separately controlled by their corresponding inputs $V_4, V_5, V_6$ (e.g., $V_4$ applied to electrode 601). The free FM layer 620 may be connected between all three devices as a common ground. The output voltage read from the pinned FM layer 640 is combined from the three devices and swings between ground and Vdd.

In the discrete device implementation, it is assumed that each device contributes to the output current capability a specific amount. Thus, a current source 670 of greater capability (than the contributions of the devices) will overpower the device, and the voltage will drift high. When the current pulled by the combination of on and off devices is higher than that of the current source 670 the output voltage will drift low. This can be configured to act as a majority or minority gate, by varying the current or the number of inputs the configuration can also be used to create an AND or NAND gate. The output (at Vread) can be connected to other devices, including ME-MJT devices, CMOS devices, TFET devices, and the like through an appropriate interface. The interface may include any suitable metal interconnections, pads, wires, substrates, and/or packaging.

It should be understood that the examples and embodiments described herein are for illustrative purposes only and that various modifications or changes in light thereof will be suggested to persons skilled in the art and are to be included within the spirit and purview of this application.

What is claimed is:

1. A magneto-electric (ME) magnetic tunnel junction (MTJ)-based Boolean device, comprising:
   an exchange bias controlled switch on a pinned ferromagnetic layer;
   a first input electrode connected to the exchange bias controlled switch;
   a second input electrode connected to the exchange bias controlled switch; and
   a third input electrode connected to the exchange bias controlled switch,
   wherein the first input electrode applies a first voltage to a ME layer of the exchange bias controlled switch, the second input electrode applies a second voltage to the ME layer, and the third input electrode applies a third voltage to the ME layer to output a function result of the Boolean device at the pinned ferromagnetic layer.

2. The MTJ-based Boolean device of claim 1, wherein the pinned ferromagnetic layer is pinned in a particular orientation by an antiferromagnetic layer.

3. The ME-MTJ-based Boolean device of claim 2, wherein the antiferromagnetic layer comprises a hematite, chromium, FeMn, NiO, $MnO_2$ or $LaMnO_3$.

4. The ME-MTJ-based Boolean device of claim 2, wherein the pinned ferromagnetic layer is pinned in a first direction by the antiferromagnetic layer, whereby the Boolean device is a majority logic gate.

5. The ME-MTJ-based Boolean device of claim 2, wherein the pinned ferromagnetic layer is pinned in a second direction by the antiferromagnetic layer, whereby the Boolean device is a minority logic gate.

6. The MTJ-based Boolean device of claim 1, wherein the exchange bias controlled switch comprises the ME layer on a free ferromagnetic layer that is connected to ground, and the ferromagnetic layer is separated from the pinned ferromagnetic layer by an insulator.

7. The ME-MTJ-based Boolean device of claim 6, wherein the free ferromagnetic layer comprises at least one of $\gamma\text{-Fe}_2O_3$, FeO, $Fe_3O_4$, MnBi, Ni, $CrO_2$, FePt, FePd, CoPd, and $LaSrMnO_3$, and wherein the pinned ferromagnetic layer comprises at least one of $\gamma\text{-Fe}_2O_3$, FeO, $Fe_3O_4$, MnBi, Ni, $CrO_2$, FePt, FePd, CoPd, and $LaSrMnO_3$.

8. The ME-MTJ-based Boolean device of claim 1, wherein the ME layer comprises chromia, boron doped chromia, rare earth ferrite, $SrCo_2Ti_2Fe_8O_{19}$, $Ni_{0.5}Zn_{0.5}Fe_2O_4$, or BFO ($BiFeO_3$).

9. The ME-MTJ-based Boolean device of claim 1, wherein the ME-MTJ-based Boolean device is a five-input device, the device further comprising:
   a fourth input electrode connected to the exchange bias controlled switch; and
   a fifth input electrode connected to the exchange bias controlled switch,
   wherein the first input electrode applies the first voltage to the ME layer, the second input electrode applies the second voltage to the ME layer, the third input electrode applies the third voltage to the ME layer, the fourth input electrode applies a fourth voltage to the ME layer, and the fifth input electrode applies a fifth voltage to output the function result.

10. An electronic circuit comprising the ME-MTJ-based Boolean device of claim 1 and at least one complementary metal oxide semiconductor (CMOS) device.

11. The electronic circuit of claim 10, wherein the function result is input to the CMOS device.

12. The electronic circuit of claim 10, wherein at least one of the first input electrode, the second input electrode, and the third input electrode is connected to a corresponding one of the at least one CMOS device.

13. An adder comprising the ME-MTJ-based Boolean device of claim 1.

14. A memory unit comprising the ME-MTJ-based Boolean device of claim 1.

15. A microprocessor comprising the ME-MTJ-based Boolean device of claim 1.

16. A magneto-electric (ME) magnetic tunnel junction (MTJ) device-based logic gate comprising:
   a first ME-MTJ device having a first input electrode applying a first input voltage to the first ME-MTJ device;
   a second ME-MTJ device having a second input electrode applying a second input voltage to the second ME-MTJ device; and
   a third ME-MTJ device having a third input electrode applying a third input voltage to the third ME-MTJ device,
   wherein the first, second, and third ME-MTJ devices share a common ground and are connected at an output of a pinned ferromagnetic layer of each of the first, second, and third ME-MTJ devices.

17. The ME-MTJ-based logic gate of claim 16, wherein the common ground is connected through a free ferromagnetic layer of each of the ME-MTJ devices.

18. The ME-MTJ-based logic gate of claim 16, further comprising a current source connected to the output.

19. The ME-MTJ-based logic gate of claim 16, further comprising an interface to a complementary metal oxide semiconductor device at the output.

\* \* \* \* \*